(12) United States Patent
Simmonet

(10) Patent No.: US 7,145,185 B2
(45) Date of Patent: Dec. 5, 2006

(54) VOLTAGE-CONTROLLED BIDIRECTIONAL SWITCH

(75) Inventor: Jean-Michel Simmonet, Veretz (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 10/500,183
(22) PCT Filed: Dec. 27, 2002
(86) PCT No.: PCT/FR02/04581

§ 371 (c)(1),
(2), (4) Date: Jun. 25, 2004

(87) PCT Pub. No.: WO03/056631

PCT Pub. Date: Jul. 10, 2003

(65) Prior Publication Data

US 2005/0017263 A1    Jan. 27, 2005

(30) Foreign Application Priority Data

Dec. 28, 2001    (FR) ................................. 01 17044

(51) Int. Cl.
*H01L 29/74* (2006.01)
*H01L 29/417* (2006.01)

(52) U.S. Cl. ................. 257/119; 257/121; 257/107; 257/110; 257/122; 257/123; 257/120; 257/157

(58) Field of Classification Search ............. 257/119, 257/121, 122, 124, 135, 140, 141, 161, 162, 257/167, 145

See application file for complete search history.

(56) References Cited

U.S. PATENT DOCUMENTS

| 4,994,884 | A | | 2/1991 | Kato et al. |
| 5,608,235 | A | * | 3/1997 | Pezzani ...................... 257/119 |
| 5,889,374 | A | * | 3/1999 | Pezzani ...................... 318/254 |
| 6,034,381 | A | * | 3/2000 | Pezzani ...................... 257/107 |
| 6,380,565 | B1 | | 4/2002 | Duclos et al. |
| 2002/0053939 | A1 | | 5/2002 | Pezzani |

OTHER PUBLICATIONS

International Search Report from corresponding International Application No. PCT/FR02/04581, filed Dec. 27, 2002.

* cited by examiner

*Primary Examiner*—Nathan J. Flynn
*Assistant Examiner*—Frazli Erdem
(74) *Attorney, Agent, or Firm*—Lisa K. Jorgenson; James H. Morris; Wolf, Greenfield & Sacks, P.C.

(57) ABSTRACT

The invention concerns a voltage-controlled triac-type component, formed in a N-type substrate (1) comprising first and second vertical thyristors (Th1, Th2), a first electrode (A2) of the first thyristor, on the front side of the component, corresponding to a first N-type region (6) formed in a first P-type box (5), the first box corresponding to a first electrode (A2) of the second thyristor, the first box containing a second N-type region (8); and a pilot structure comprising, above an extension of a second electrode region (4) of the second thyristor, a second P-type box (11) containing third and fourth N-type regions, the third region (12) and a portion of the second box (11) being connected to a gate terminal (G), the fourth region (13) being connected to the second region (8).

8 Claims, 5 Drawing Sheets

VOLTAGE-CONTROLLED BIDIRECTIONAL SWITCH

BACKGROUND OF THE INVENTION

1. Field of the Invention

The present invention relates to the field of medium power bidirectional switches, and for example of bidirectional switches connectable on the electric A.C. supply network, capable of withstanding voltages of several hundreds of volts.

2. Discussion of the Related Art

Among known medium-power bidirectional switches, triacs have the advantage of being able to withstand voltages of one polarity or the other, that is, they can be directly placed in a circuit supplied by an A.C. supply network, and further have the advantage of being able to be controlled by a positive or negative gate signal.

However, a disadvantage of triacs is that they are controlled by injection of a current. In many cases, it would be preferred for this control to be performed by a voltage, that is, for the triac to turn on when the voltage applied to its control terminal becomes greater, in absolute value, than a determined threshold.

A known solution to overcome this disadvantage is to arrange, in series with the gate terminal of a triac, a diac or bidirectional Schottky diode, which turns on when the voltage thereacross exceeds a determined threshold. However, despite the many attempts performed, the monolithic integration of a triac or of a diac has never been achieved in a commercially exploitable manner.

SUMMARY OF THE INVENTION

Thus, an object of the present invention is to provide a monolithic component of voltage-controlled triac type.

To achieve this and other objects, the present invention provides a monolithic component of voltage-controlled triac type, formed in a substrate of a first conductivity type, including first and second vertical thyristors, a first main electrode of the first thyristor, on the front surface side of the component, corresponding to a first region of the first conductivity type formed in a first well of the second conductivity type, said first well corresponding to a first main electrode of the second thyristor, the first well containing a second region of the first conductivity type; and a pilot structure including, on the front surface side, above an extension of a second main electrode region of the second thyristor, a second well of the second conductivity type containing third and fourth regions of the first conductivity type, the third region and a portion of the second well being connected to a gate terminal, the fourth region being connected to the second region.

According to an embodiment of the present invention, the component is surrounded at its periphery with a wall of the second conductivity type extending from one surface to the other of the component.

According to an embodiment of the present invention, on the front surface side, the first well includes an extension which surrounds the second well.

According to an embodiment of the present invention, the external periphery of the first well and of its extension is surrounded by a lightly-doped ring of the second conductivity type.

The foregoing object, features and advantages of the present invention, will be discussed in detail in the following non-limiting description of specific embodiments in connection with the accompanying drawings, in which:

DETAILED DESCRIPTION

Figure 1:
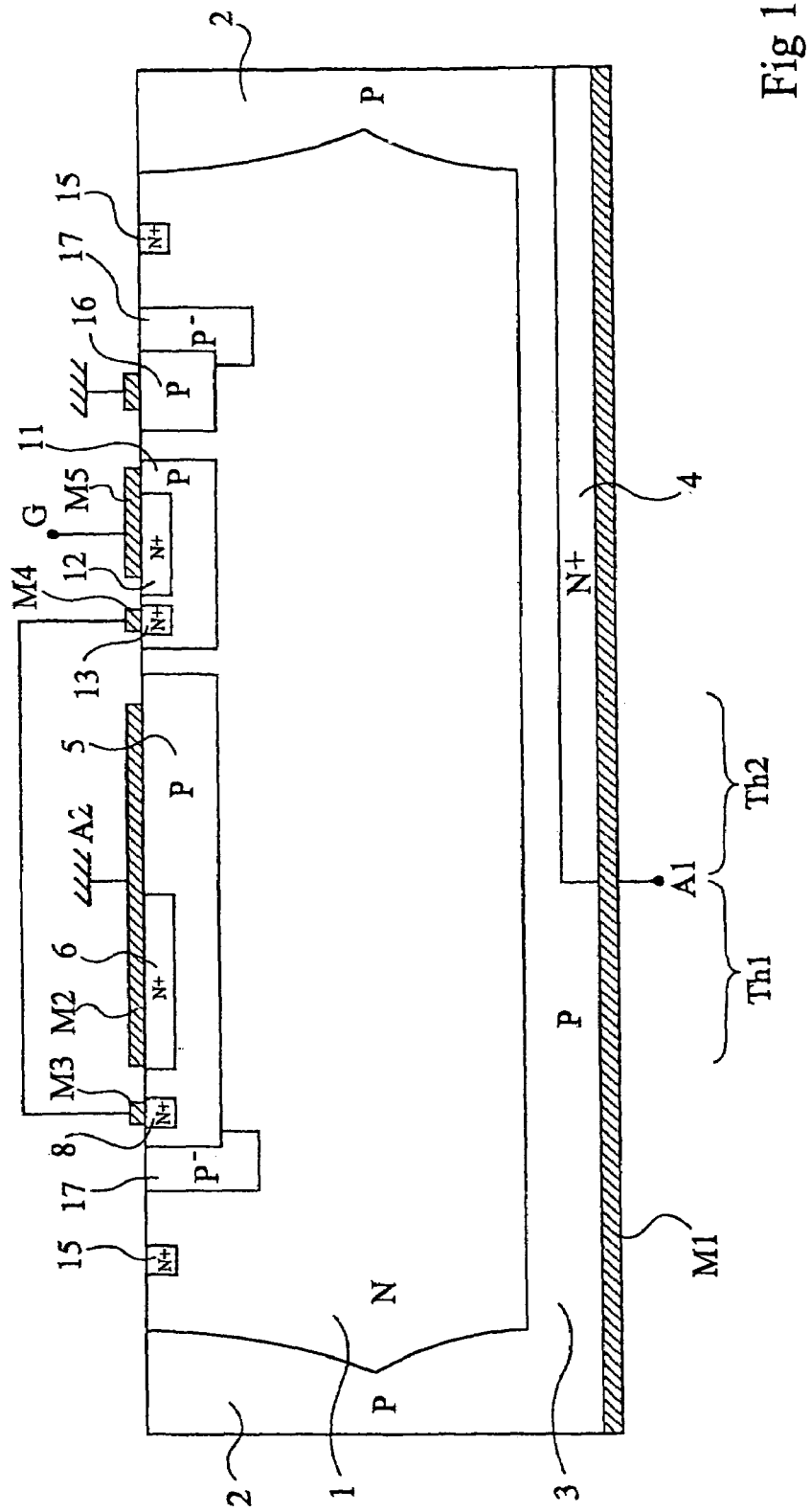
FIG. 1 shows an embodiment of a bidirectional switch according to the present invention.

As illustrated in FIG. 1, a monolithic voltage-controlled bidirectional switch according to the present invention is formed in a portion 1 of a lightly-doped N-type semiconductor substrate delimited by a heavily-doped P-type isolating wall 2. The component includes a proper switch structure corresponding to thyristors Th1 and Th2. This structure includes, on the lower surface side, a P-type layer 3 in a portion of which is formed an $N^+$-type region 4 and, on the upper surface side, a P-type well 5 in which is formed an $N^+$-type region 6. Thus, thyristor Th1 includes from its anode to its cathode portions of regions and layers 3-1-5-6. Thyristor Th2 includes from its anode to its cathode portions of regions and layers 5-1-3-4.

The entire lower surface of the component is coated with a metallization M1 connected to a first main terminal A1 of the switch, terminal A1 being intended to be connected to an A.C. power supply. The upper surfaces of well 5 and of $N^+$ region 6 are covered with a metallization M2 connected to a terminal A2 forming the second main terminal of the component and normally grounded.

To achieve a voltage control of this switch, the present invention provides, on the one hand, an additional $N^+$-type region 8 formed in P-type well 5 and coated with a metallization M3. It should be noted that metallization M3 is only in contact with additional region 8 and not with well 5. Further, the present invention provides a pilot structure including on the upper surface side a P-type well 11 in which are formed separate $N^+$-type regions 12 and 13. Region 13 is coated with a metallization M4. Region 12 and a portion of the upper surface of well 11 are covered with a metallization M5 connected to a gate terminal G.

Further, the component includes various means intended to guarantee its breakdown voltage. A given lateral distance of the N well is left free between peripheral wall 2 and the lateral ends of the elements described hereabove of the switch and of the pilot structure. In this free area is preferably provided an $N^+$ ring 15 having a channel stop function, this ring being possibly coated with a metallization not connected to an external terminal. Further, a P well 16 connected to ground like P well 5 is provided outside of well 11 of the pilot area. In top view, well 16 forms an extension of well 5 which surrounds well 11. The external periphery of P wells 5 and 16 is bordered with a lightly-doped P-type well ring 17.

The operation of the bidirectional voltage-controlled switch according to the present invention in the four possible starting quadrants will now be discussed in relation with FIGS. 2 and 3.

Figure 2:
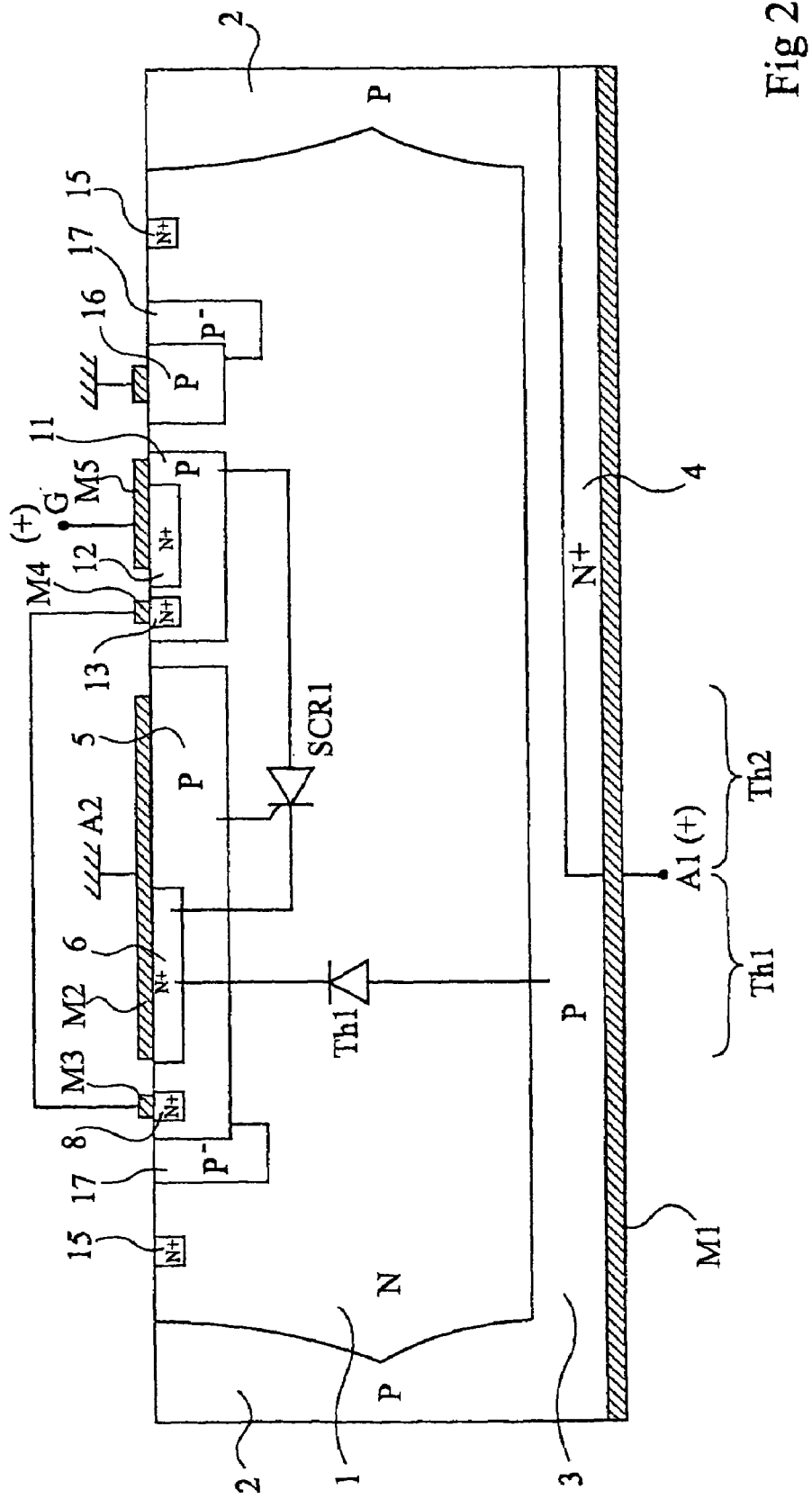
FIG. 2 is intended to explain the triggering of a bidirectional switch according to the present invention in quadrants Q1 and Q4.

FIG. 2 illustrates the operation of a switch according to the present invention controlled in quadrant Q1, that is, when terminal A1 is positive with respect to terminal A2 and the voltage on the gate is positive. In this configuration, main thyristor Th1 is likely to be turned on.

When the voltage on gate terminal G becomes greater than the sum of the forward voltage drop of the diode corresponding to the junction between P well 11 and $N^+$ region 13 and of the avalanche voltage of the zener diode corresponding to the reverse voltage between $N^+$-type region 8 and P well 5, a current flows from metallization M5 to metallization M4, from metallization M3 to metallization M4, and from metallization M3 to metallization M2. This current turns on a lateral pilot thyristor SCR1 having its anode corresponding to well 11 and its cathode corresponding to region 6, that is, which includes regions and layers 11-1-5-6. The starting of pilot thyristor SCR1 generates carriers at the level of the junction between substrate 1 and well 5, and thus starts main thyristor Th1 (3-1-5-6).

In the fourth quadrant, in which the voltage on the gate is positive and in which terminal A1 of the triac is negative with respect to terminal A2, the operation is similar to that of the first quadrant as concerns the starting of pilot thyristor SCR1. However, given the biasing of the main electrodes, the turning-on of pilot thyristor SCR1 turns on thyristor Th2.

Figure 3:
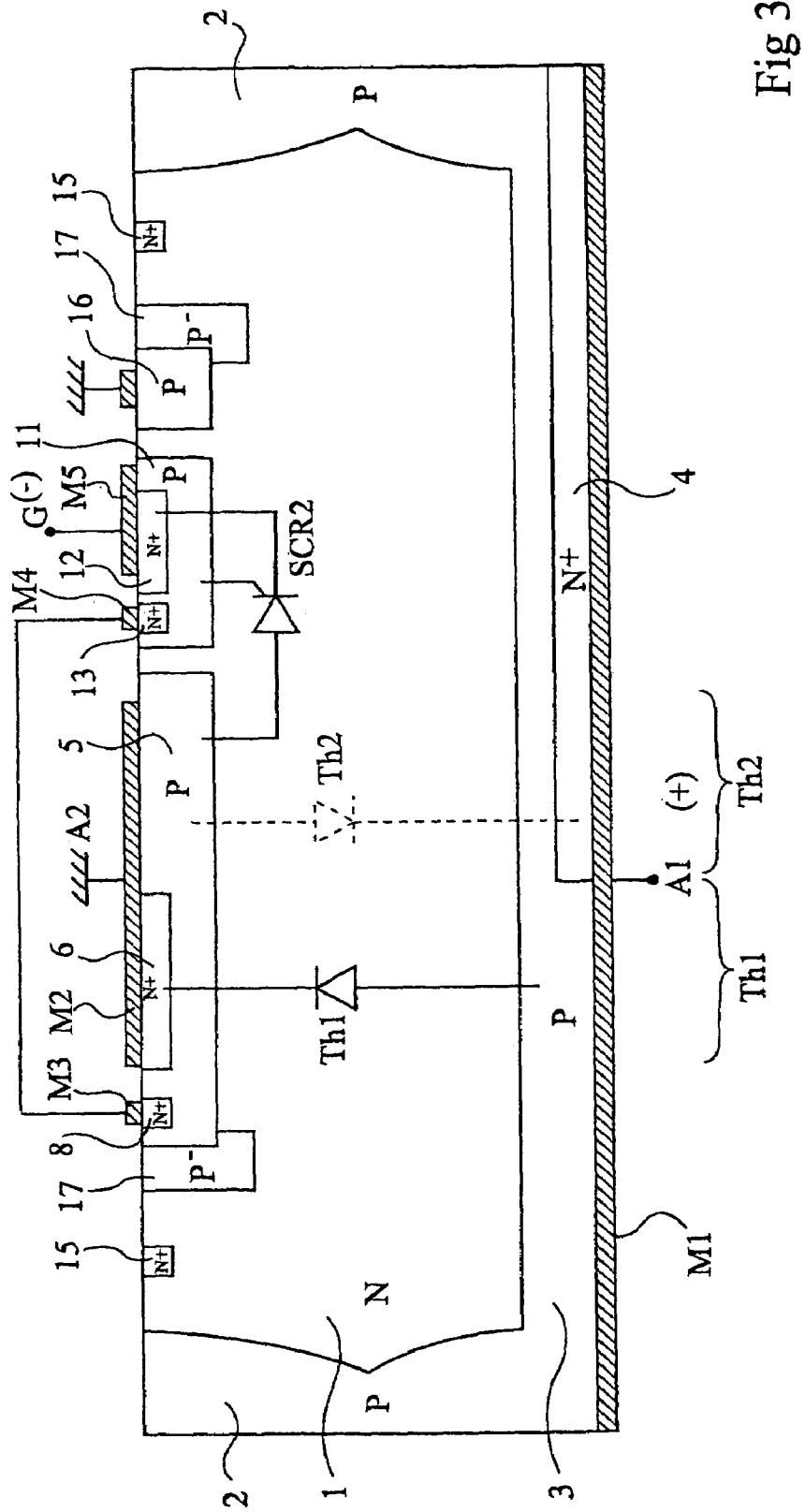
FIG. 3 is intended to explain the triggering of a bidirectional switch according to the present invention in quadrants Q2 and Q3.

FIG. 3 illustrates the operation of the device according to the present invention in the second quadrant, that is, when electrode A1 is positive with respect to electrode A2 and the gate electrode is negative with respect to electrode A2. Then, as soon as the negative voltage on terminal G exceeds a given threshold, a current flows from terminal A2 to terminal G, through well 5, the forward junction between this well and region 8, the connection between metallization M3 and metallization M4, the reverse junction between region 13 and well 11, and flows into well 11 towards metallization M5 under region 12. Due to the resistance of the P well under region 12, a voltage drop is created which, when it exceeds 0.6 volts, turns on $PN^+$ junction 11–12. This starts a lateral thyristor SCR2 having its anode corresponding to P well 5 and its cathode corresponding to $N^+$-type region 12, and which includes regions and layers 5-1-11-12. The turning-on of this pilot thyristor creates a carrier generation at the interface between well 5 and substrate 1 and turns on thyristor Th1.

In quadrant Q3, in which electrode A1 is negative with respect to electrode A2, and in which a negative voltage is applied on the gate, the operation is similar as concerns the starting of lateral thyristor SCR2, but this time, thyristor Th2 is turned on, the carrier generation in the substrate turning on the junction between substrate 1 and P-type layer 3.

Figure 4:
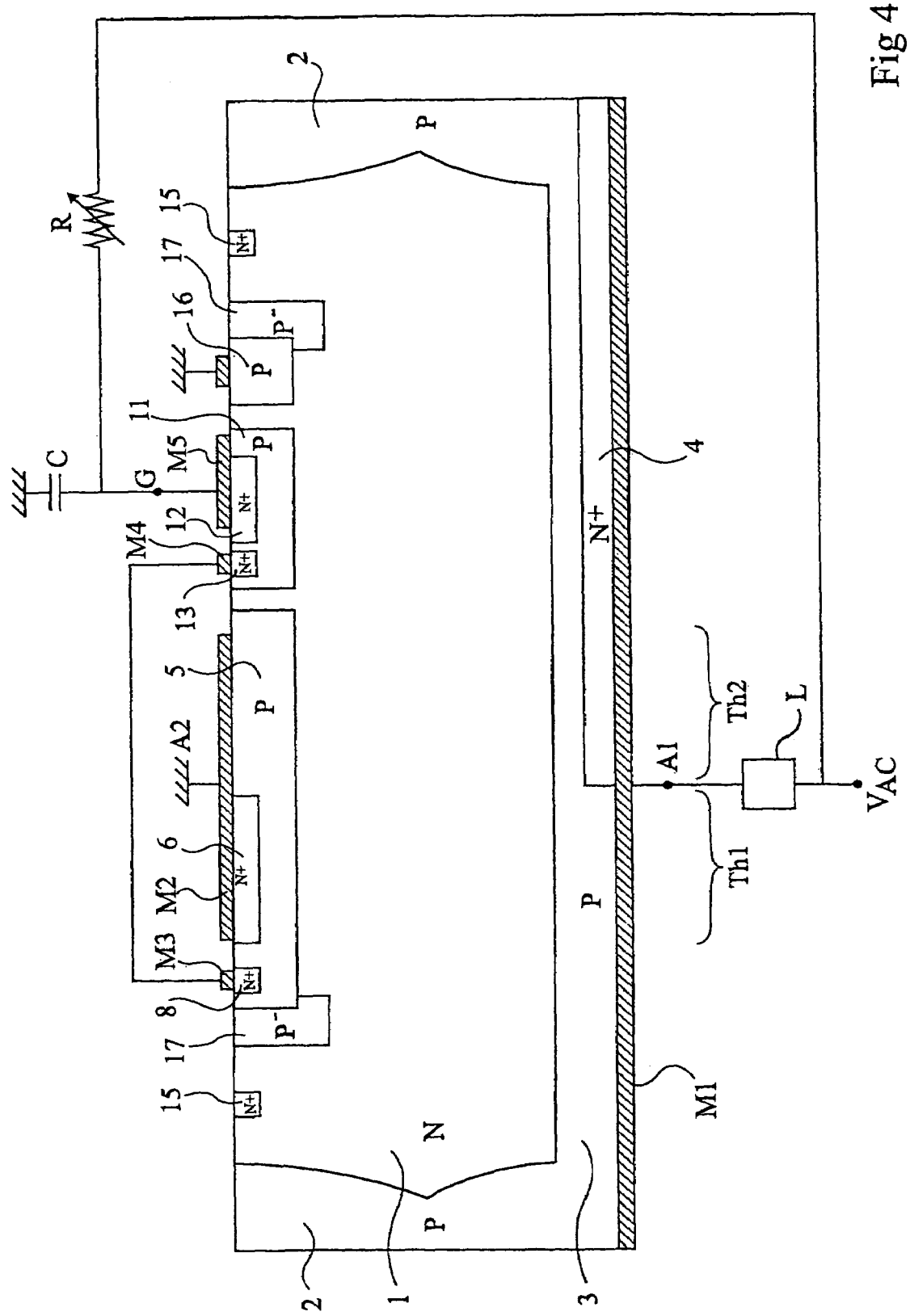
FIG. 4 shows the assembly of a bidirectional switch according to the present invention in an application to a light dimmer.

FIG. 4 shows an example of application of a component according to the present invention to the forming of a light dimmer.

An A.C. voltage is connected to terminal A1 via a load L, for example, an electric light bulb having a power of some hundred watts, terminal A2 being grounded and forming the second terminal of the supply voltage. The A.C. voltage is also applied to gate terminal G via an adjustable resistor R. The gate is also grounded via a capacitor C. Thus, at the beginning of a halfwave, capacitor C progressively charges with a time constant which depends on the setting of resistor R. When the voltage on capacitor C reaches the positive or negative threshold voltage corresponding to the voltage of a forward diode and of a reverse diode, one or the other of thyristors Th1 or Th2 turns on according to the biasing of the considered halfwave. A dimmer has thus very simply been made with a single semiconductor component. It should be noted that the starting occurs in quadrant Q1 or in quadrant Q3 according to whether the considered halfwave is positive or negative. Given that the dopings of P wells 5 and 11 and of $N^+$ regions 8 and 13 are respectively identical, the turn-on threshold is substantially identical for negative halfwaves and for positive halfwaves.

Of course, the present invention is likely to have various alterations, modifications, and improvements which will readily occur to those skilled in the art. In particular, as concerns the dimensions of the various elements, it should be clear that the drawings are very simplified and that most of the component surface area is taken up by the switch structure corresponding to thyristors Th1 and Th2 and that the surface area of the pilot thyristor is relatively small. Further, all conductivity types could be inverted, the polarities of the various voltages being modified accordingly.

Figure 5:
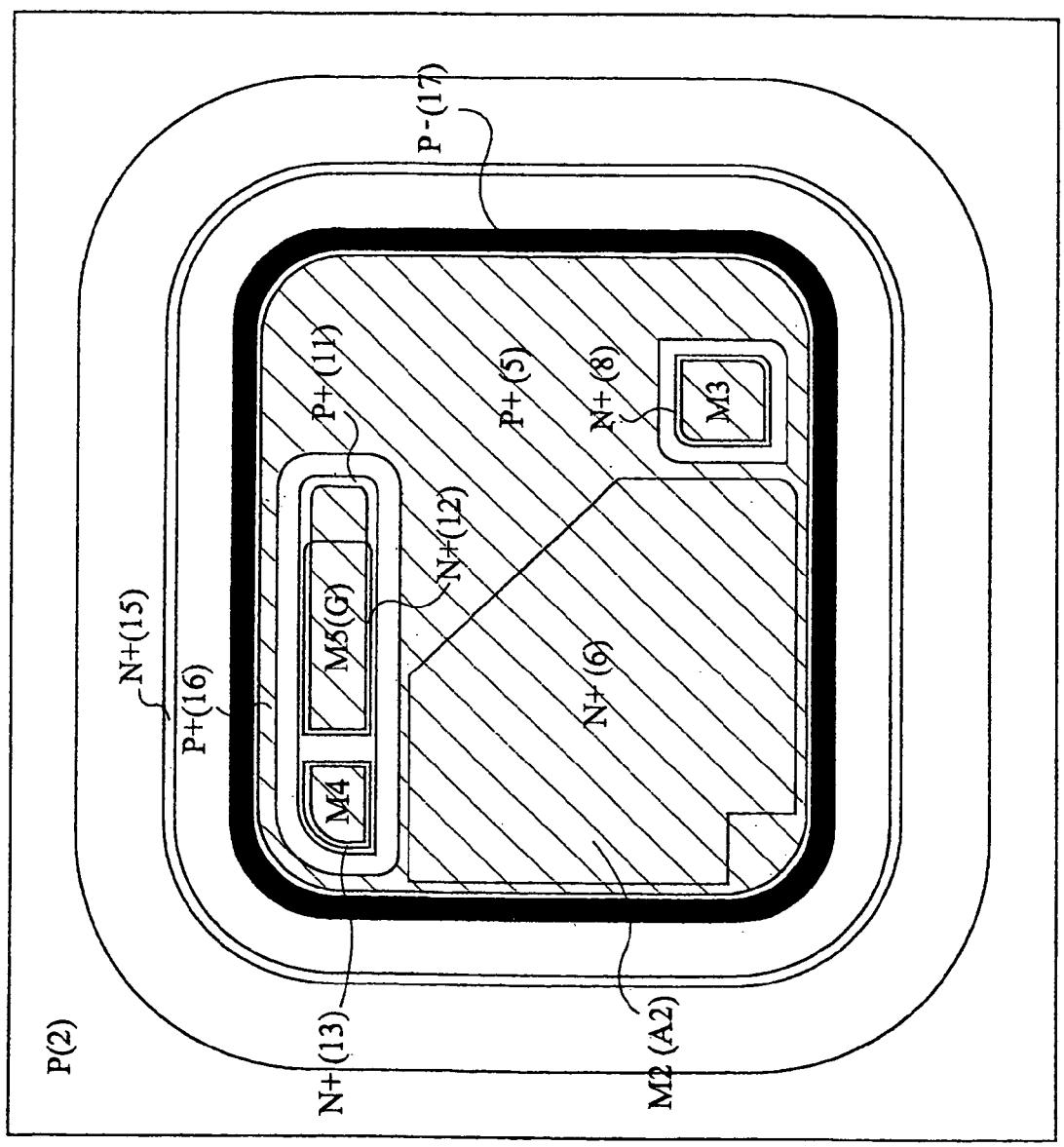
FIG. 5 is a simplified top view of an embodiment of a bidirectional switch according to the present invention.

FIG. 5 is a simplified top view of an embodiment of a bidirectional switch according to the present invention. In this drawing, the same elements as in FIG. 1 will be designated with the same references. In the illustrated embodiment, well 16 forms an extension of well 5 which surrounds well 11.

Having thus described at least one illustrative embodiment of the invention, various alterations, modifications, and improvements will readily occur to those skilled in the art. Such alterations, modifications, and improvements are intended to be within and scope of the invention. Accordingly, the foregoing description is by way of example only and is not intended as limiting. The invention is limited only as defined in the following claims and the equivalents thereto.

What is claimed is:

1. A voltage-controlled monolithic component of triac type, formed in a substrate of a first conductivity type, including:

first and second vertical thyristors, a first main electrode of the first thyristor, on a front surface side of the component, corresponding to a first region of a first conductivity type formed in a first well of a second conductivity type, said first well corresponding to a first main electrode of the second thyristor, the first well containing a second region of the first conductivity type; and a pilot structure including, on the front surface side, above an extension of a second main electrode region of the second thyristor, a second well of the second conductivity type containing third and fourth regions of the first conductivity type, the third region and a portion of the second well being connected to a gate terminal, the fourth region being connected to the second region.

2. The component of claim 1, wherein the component is surrounded at its periphery with a wall of the second conductivity type extending from one surface to the other of the component.

3. The component of claim 2, wherein, on the front surface side, the first well includes an extension which surrounds the second well.

4. The component of claim 3, wherein an external periphery of the first well and of its extension is surrounded with a lightly-doped ring of the second conductivity type.

5. A voltage-controlled monolithic component of triac type, formed in a substrate of a first conductivity type comprising:
- a first well of a second conductivity type comprising a first and second region of the first conductivity type;
- a pilot structure comprising a second well of the second conductivity type and a third and fourth region of the first conductivity type, wherein the third region and a portion of the second well are connected to a gate terminal, and wherein the second region and fourth region are connected; and
- a first thyristor comprising a first main electrode corresponding to the first region and a second thyristor comprising a first main electrode corresponding to the first well, wherein an extension of a second main electrode of the second thyristor is located below the pilot structure.

6. The component of claim 5, wherein the component is surrounded at its periphery with a wall of the second conductivity type extending from one surface to the other of the component.

7. The component of claim 6, wherein, on the front surface side, the first well includes and extension which surrounds the second well.

8. The component of claim 7, wherein an external periphery of the first well and of its extension is surrounded with a lightly-doped ring of the second conductivity type.

* * * * *